United States Patent [19]

Yoshihisa et al.

[11] Patent Number: 4,511,849

[45] Date of Patent: Apr. 16, 1985

[54] FM PULSE COUNTING DEMODULATOR WITH MULTIPLIER FOR INPUT AND DELAYED INPUT SIGNALS

[75] Inventors: Kozo Yoshihisa; Isamu Okui, both of Fukaya, Japan

[73] Assignee: Tokyo Shibaura Denki Kabushiki Kaisha, Kanagawa, Japan

[21] Appl. No.: 279,078

[22] Filed: Jun. 30, 1981

[30] Foreign Application Priority Data

Jul. 3, 1980 [JP] Japan .................. 55-90940

[51] Int. Cl.³ .................. H03D 3/14; H03D 3/04
[52] U.S. Cl. .................. 329/103; 329/126; 329/134; 329/145; 455/214
[58] Field of Search .................. 329/103, 110, 126, 134, 329/145; 455/214, 337

[56] References Cited

U.S. PATENT DOCUMENTS

| 4,054,840 | 10/1977 | Sato | 455/214 X |
| 4,100,500 | 7/1978 | Ohsawa et al. | 329/103 |
| 4,146,842 | 3/1979 | Fukushima et al. | 455/214 X |
| 4,232,268 | 11/1980 | Hinn | 329/103 |
| 4,280,100 | 7/1981 | Dann | 329/103 |
| 4,342,000 | 7/1982 | Ogita | 455/214 X |

OTHER PUBLICATIONS

Denshi Tenbov, "Application of PLL IC Communicating System," Semiconductor Technical, Aug. 1972, pp. 92–97.

FOREIGN PATENT DOCUMENTS 158733 12/1980 Japan .................. 329/103

Primary Examiner—Eugene R. Laroche
Assistant Examiner—W. R. Paxman
Attorney, Agent, or Firm—Banner, Birch, McKie & Beckett

[57] ABSTRACT

According to the present invention, an FM signal is applied to a limiter through a signal input terminal to remove a noise element included in the FM signal. The limited FM signal is then supplied to a delay means for delaying the signal for a predetermined time. The delayed signal is then supplied to one of a pair of input terminals of a multiplying circuit. Either the limited FM signal or a reference potential is supplied to the other input terminal of the multiplying circuit. The multiplying circuit demodulates the FM signal which is then supplied to a low pass filter. The low pass filter transforms the demodulated signal into an analog signal which is then supplied to a signal output terminal.

1 Claim, 8 Drawing Figures

FM PULSE COUNTING DEMODULATOR WITH MULTIPLIER FOR INPUT AND DELAYED INPUT SIGNALS

BACKGROUND OF THE INVENTION

This invention relates to a frequency modulation (FM) signal demodulating circuit and more particularly, to a demodulating circuit employing pulse counting.

Television broadcasting stations in Japan broadcast monophonic programs, stereophonic programs and bilingual programs. In the case of the monophonic program, only a primary carrier (4.5 MHz) is modulated by the frequency of a monophonic signal; its FM monophonic signal is superimposed upon a composite video signal. In the stereophonic program, a subaudio signal and a pilot signal (983.5 Hz), in addition to a main audio signal, are employed. A subcarrier (approximately 31.5 KHz) is modulated by the frequency of the subaudio signal to the extent of ±10 KHz. A control signal (55.125 KHz) is modulated by the amplitude of the pilot signal. The FM audio subcarrier signal and the AM control signal are superimposed upon the main audio signal to produce a composite signal. The main carrier is modulated by the frequency of this composite signal, and the resulting FM composite audio signal is superimposed upon a composite video signal.

In the case of the bilingual program, a pilot signal (922.5 Hz) is employed. This pilot signal is used, as in the case of the stereophonic program, to amplitude modulate the control signal. The main audio signal and the subaudio signal are utilized as in the case of the stereophonic program to produce the FM composite audio signal.

Various methods are known in the prior art to demodulate the FM audio subcarrier signal included in the composite audio signal. For example, either the pulse counting method or the phase-locked loop (PLL) method can be employed. A conventional FM signal demodulating circuit employing pulse counting is shown in FIG. 1. FIG. 2 shows waveforms of the signals at each point of the circuit of FIG. 1. As shown, an FM subcarrier signal (FIG. 2a) is supplied to a limiter 11 through an input terminal 10. The FM signal is limited by limiter 11 in order to remove any noise included in the FM signal. The limited FM signal (FIG. 2b) is supplied from a pair of output terminals to a differential circuit 12. Circuit 12 comprises a serially connected resistor $R_{11}$ and the primary winding of transformer $T_{11}$ which are connected between output terminals of circuit 11. The limited FM signal is differentiated by circuit 12 which produces the differentiated FM signal shown in FIG. 2c. The differentiated signal is supplied from the secondary end taps of transformer $T_{11}$ to the respective cathode electrode of diodes $D_{11}$ and $D_{12}$. The secondary's center tap is grounded. Diodes $D_{11}$, $D_{12}$ function as a full-wave detector and produce the detected signal as shown in FIG. 2d. That is, a demodulated subaudio signal is produced at the connection point of diodes $D_{11}$, $D_{12}$. This demodulated signal is supplied to an integrating circuit 13 and to a resistor $R_{12}$ which is connected between the anode of diode $D_{11}$ and ground. Integrating circuit 13 is a series circuit, connected across resistor $R_{12}$, comprising a resistor $R_{13}$ and a condenser $C_{11}$. Circuit 13 transforms the demodulated signal into the analog subaudio signal (FIG. 2e) necessary for driving a speaker. This subaudio signal is supplied from a connection point of resistor $R_{13}$ and condenser $C_{11}$ to an output terminal 14. Prior art circuits which include a transformer, such as $T_{11}$, have the disadvantage that they can not be fabricated into a semiconductor integrated circuit.

In addition, a conventional FM signal demodulating circuit employing the PLL method is shown in FIG. 3. As shown, an FM subcarrier signal is supplied to a limiter 21 through an input terminal 20. The limited FM signal is supplied to a PLL 22. PLL 22 comprises a phase comparator 23, a low-pass filter (LPF) 24, a direct current (DC) amplifier 25 and a voltage-controlled oscillator (VCO) 26. The limited FM signal and an oscillation signal from the VCO 26 are supplied to input terminals of comparator 23. An error signal between the limited FM signal and the oscillation signal (i.e., a demodulated, subaudio signal) is produced by comparator 23. This demodulated signal is transformed into an analog subaudio signal by LPF 24. The analog subaudio signal, after amplification by DC amplifier 25, is supplied to an output terminal 30. The output of DC amplifier 25 is also fedback to VCO 26 in order to control its oscillation frequency. In operation, PLL 22 is synchronized with the frequency of the limited FM signal; consequently, the oscillation frequency of VCO 26 varies in accordance with the frequency of this limited signal. This is shown by the characteristic graph of the demodulating circuit in FIG. 4. The abscissa indicates the frequency of the FM audio subcarrier signal, and the ordinate indicates the demodulated output voltage. The capture range for this circuit is shown to be from 21.5 KHz to 41.5 KHz.

This prior art circuit, however, has the following disadvantages: (1) When the FM subaudio signal is overmodulated over the capture range, distortion of the demodulated output signal is produced; (2) Since PLL 22 includes a low pass filter (LPF 24), a delay of the demodulated output signal occurs, accordingly, a time correction means for the delayed output signal is necessary; (3) Such demodulating circuits are complicated and costly to manufacture; accordingly, integrating it into a semicocductor chip requires many outside connection pins and peripheral devices (e.g., capacitors).

SUMMARY OF THE INVENTION

It is accordingly an object of this invention to provide an FM signal demodulating circuit employing pulse counting which has superior demodulation performance.

It is an additional object of this invention to provide an FM signal demodulating circuit suitably fabricated as a semiconductor integrated circuit.

According to the present invention, an FM signal is applied to a limiter through a signal input terminal to remove a noise element included in the FM signal. The limited FM signal is then supplied to a delay means for delaying the signal for a predetermined time. The delayed signal is then supplied to one of a pair of input terminals of a multiplying circuit. Either the limited FM signal (FIG. 5) or a reference potential (FIG. 7) is supplied to the other input terminal of the multiplying circuit. The multiplying circuit demodulates the FM signal which is then supplied to a low pass filter. The low pass filter transforms the demodulated signal into an analog signal which is then supplied to a signal output terminal.

The objects and advantages of the present invention will become apparent to persons skilled in the art from a study of the following description of the accompanying drawings.

DESCRIPTION OF THE PREFERRED EMBODIMENT

The present invention will be described in detail with reference to the accompanaying drawings.

Figure 1:
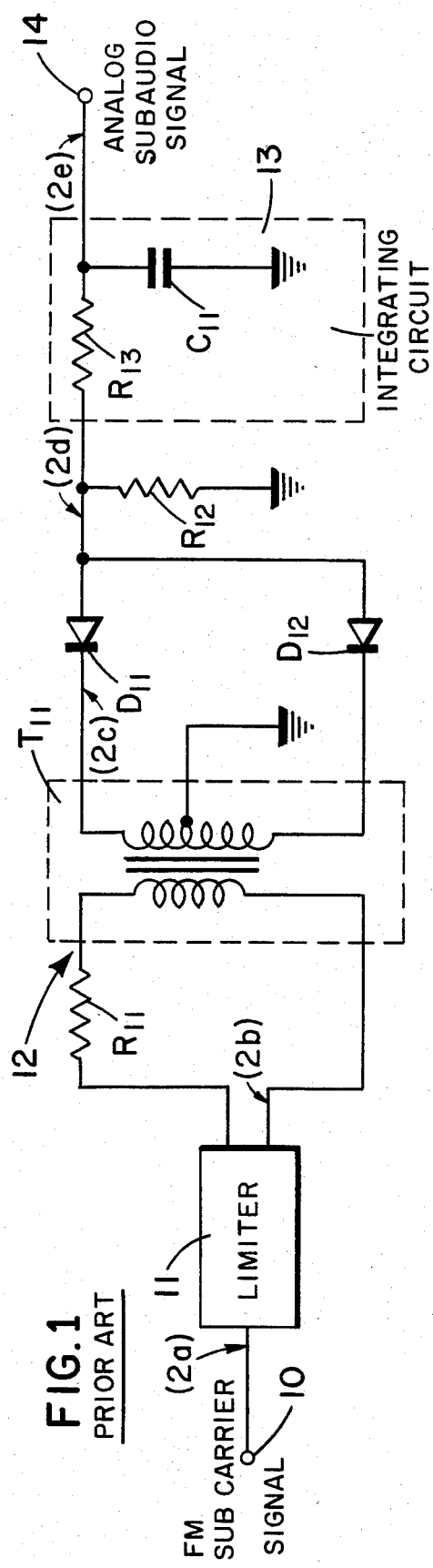
FIG. 1 is a schematic circuit diagram of a conventional FM signal demodulating circuit employing pulse counting.
Figure 2:
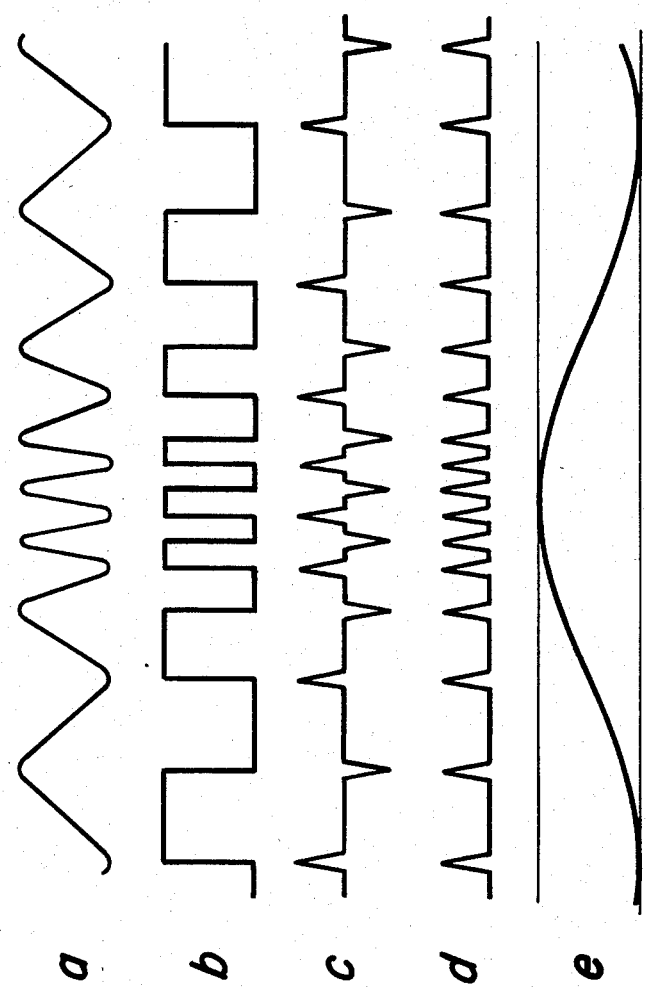
FIG. 2 is a waveform diagram of the signals at each point of the circuit shown in FIG. 1.
Figure 3:
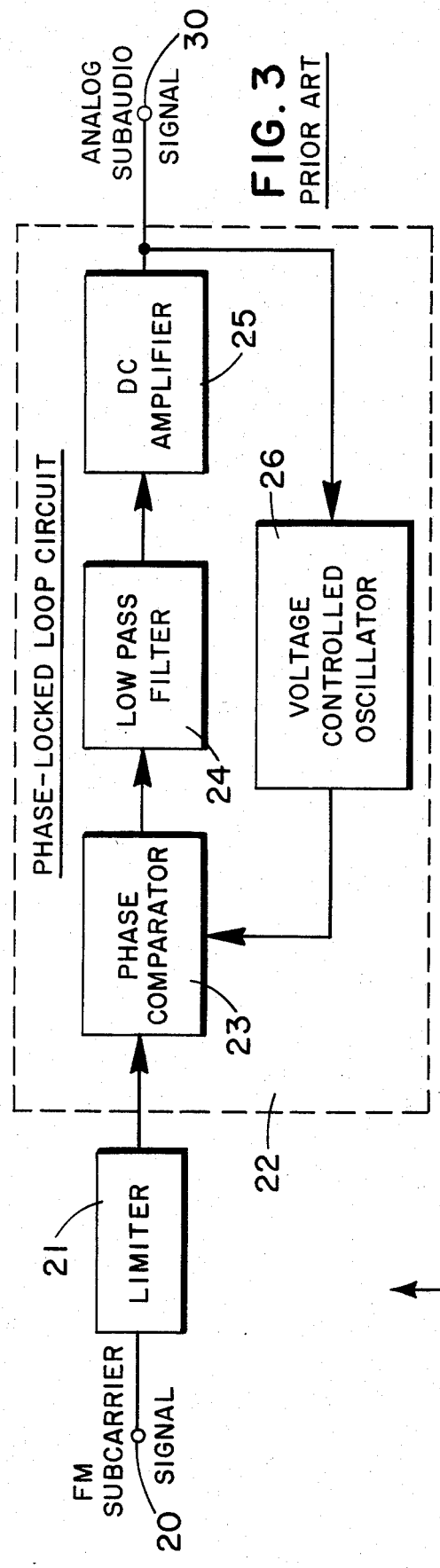
FIG. 3 is a block diagram of a fundamental constitution of a conventional FM signal demodulating circuit employing the PLL method.
Figure 4:
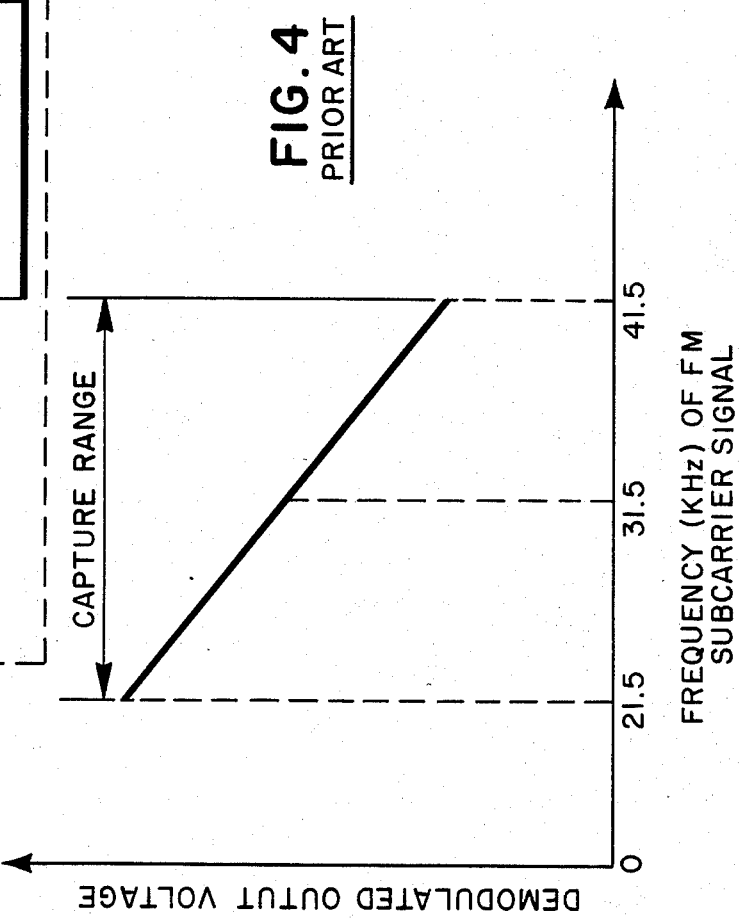
FIG. 4 is a characteristic graph of the demodulating circuit of FIG. 3.
Figure 5:
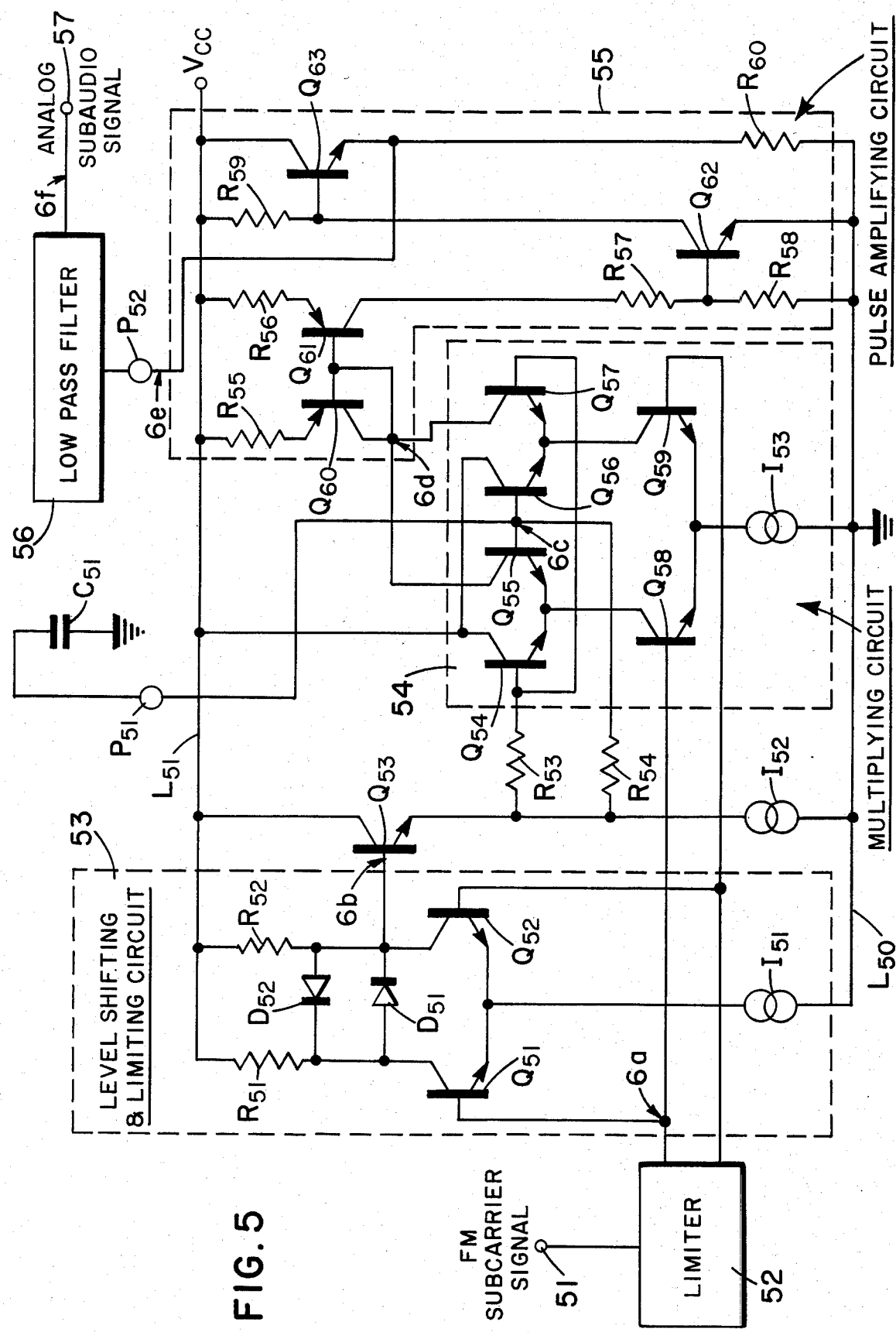
FIG. 5 is a schematic circuit diagram of an FM signal demodulating circuit according to the present invention.
Figure 6:
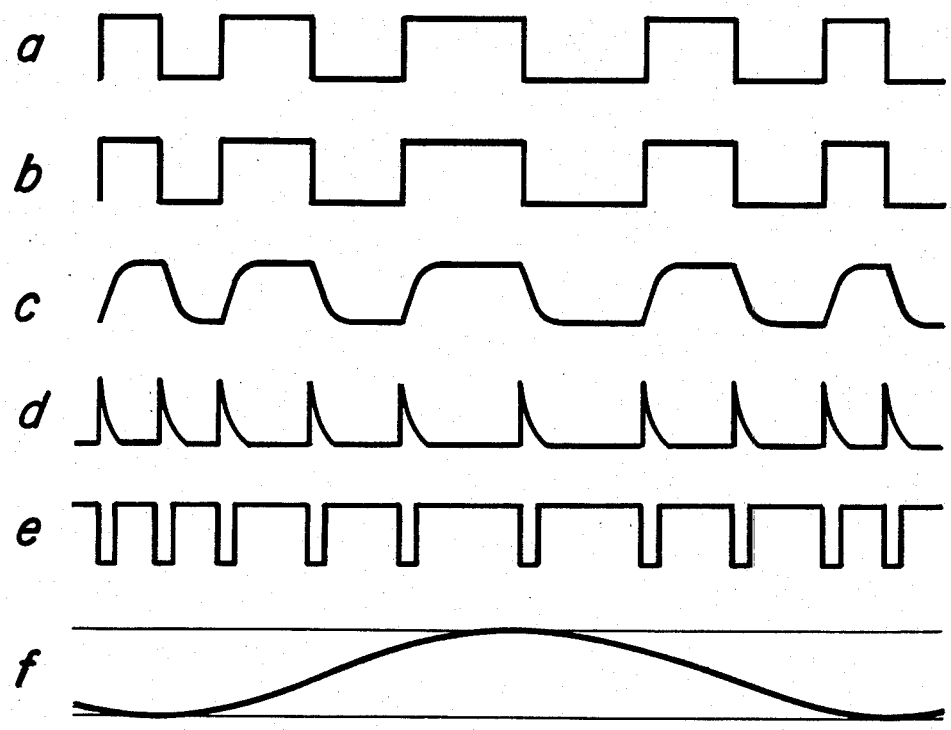
FIG. 6 is a waveform diagram of the signals at each point of the circuit shown in FIG. 5.

An FM signal demodulating circuit employing pulse counting according to the present invention is shown in FIG. 5 and the waveforms of the signals at each point of this circuit are shown in FIG. 6. An FM subcarrier signal is supplied to a limiter 52 through a signal input terminal 51. Limiter 52 removes any noise included in the FM signal. A first limited FM signal (FIG. 6a) is produced at one of a pair of output terminals of limiter 52. A second limited FM signal, having an inverse phase with the phase of the first limited FM signal, is produced at the other output terminal of limiter 52. Each of these limited signals is supplied to a level shifting and limiting circuit 53.

The level shifting and limiting circuit 53 is constructed as follows. The base electrode of a transistor $Q_{51}$ is connected to the one output terminal of limiter 52, while its collector electrode is connected to a power supply line $L_{51}$ through a resistor $R_{51}$. The base electrode of a transistor $Q_{52}$ is connected to the other output terminal of limiter 52, while its collector electrode is connected to line $L_{51}$ through a resistor $R_{52}$. The emitter electrodes of transistors $Q_{51}$, $Q_{52}$ are connected to a ground line $L_{50}$ through a common current source $I_{51}$. Transistors $Q_{51}$, $Q_{52}$ shift the level of output signal of limiter 52. A diode $D_{51}$ is connected so that its anode electrode is connected to the collector electrode of transistor $Q_{51}$, and its cathode electrode is connected to the collector electrode of transistor $Q_{52}$. A diode $D_{52}$ is connected so that its cathode electrode is connected to the collector electrode of transistor $Q_{51}$, and its anode electrode is connected to the collector electrode of transistor $Q_{52}$. Diodes $D_{51}$, $D_{52}$ limit the level of the shifted FM signal.

The resulting FM signal which is level shifted and limited (FIG. 6b) by circuit 53 is supplied to the base electrode of an emitter follower transistor $Q_{53}$. The collector electrode of transistor $Q_{53}$ is connected to power supply line $L_{51}$, while its emitter electrode is connected to ground line $L_{50}$ through a current source $I_{52}$. The emitter electrode of transistor $Q_{53}$ is also connected to one of a pair of input terminals of a multiplying circuit 54 through a resistor $R_{53}$ and a delay means. The delay means is a series connected circuit, having a resistor $R_{54}$ and condenser $C_{51}$, which serve as an integrating circuit. One of a pair of terminals of condenser $C_{51}$ is connected to resistor $R_{54}$ through an outside connection pin $P_{51}$, while its other terminal is grounded. The delay time is determined by the time constant of this integrating circuit. The delayed FM signal (FIG. 6c) is supplied to the other input terminal of multiplying circuit 54. Circuit 54 comprises a double balanced differential amplifier. The base electrodes of transistors $Q_{54}$, $Q_{57}$ are connected to $R_{53}$, while the base electrodes of transistors $Q_{55}$, $Q_{56}$ connected to $R_{54}$ and the one terminal of condenser $C_{51}$. The collector electrodes of transistors $Q_{54}$, $Q_{56}$ are connected to line $L_{51}$, while the collector electrodes of transistors $Q_{55}$, $Q_{57}$ are connected to a pulse amplifying circuit 55. Circuit 54 includes a further differential amplifier comprising transistors $Q_{58}$, $Q_{59}$. The base electrode of transistor $Q_{58}$ is connected to the one output terminal of limiter 52, while its collector electrode is connected to the emitter electrodes of transistors $Q_{54}$, $Q_{55}$. The base electrode of transistor $Q_{59}$ is connected to the other output terminal of limiter 52, while its collector electrode is connected to the emitter electrodes of transistors $Q_{56}$, $Q_{57}$. The emitter electrodes of transistors $Q_{58}$, $Q_{59}$ are connected to line $L_{50}$ through a common current source $I_{53}$. Transistors $Q_{58}$, $Q_{59}$ are alternatively switched on by the limited FM signals from limiter 52. Circuit 54, as a result, generates a pulse shaped signal (i.e., a demodulated subaudio signal—FIG. 6d) in accordance with the time difference between the level shifted and limited FM signal and the delayed FM signal. The demodulated signal is supplied from the collector electrodes of transistors $Q_{55}$, $Q_{57}$ to pulse amplifying circuit 55.

Pulse amplifier circuit 55 is connstructed as follows. The collector electrode of a transistor $Q_{60}$ is connected to the collector electrode of transistor $Q_{57}$, while its emitter electrode is connected to line $L_{51}$ through a resistor $R_{55}$. Its base electrode is connected to its collector electrode and the base electrode of a transistor $Q_{61}$. The emitter electrode of transistor $Q_{61}$ is connected to line $L_{51}$ through a resistor $R_{56}$, while its collector electrode is connected to line $L_{50}$ through resistors $R_{57}$, $R_{58}$. Transistors $Q_{60}$, $Q_{61}$ constitute a current mirror circuit. The connection point of resistors $R_{57}$, $R_{58}$ is connected to the base electrode of a transistor $Q_{62}$, where collector electrode is connected to line $L_{51}$ through a resistor $R_{59}$. Its collector electrode is also connected to the base electrode of an emitter follower transistor $Q_{63}$. Its emitter electrode is connected to line $L_{50}$. The collector electrode of transistor $Q_{63}$ is connected to line $L_{51}$. Its emitter electrode is connected to line $L_{50}$ through a resistor $R_{60}$ and to a low pass filter 56 through an outside connection pin $P_{52}$. The demodulated signal is amplified (FIG. 6e) by transistors $Q_{60}$ to $Q_{63}$ and is supplied from the emitter electrode of transistor $Q_{63}$ to filter 56. Filter 56 transforms the amplified signal into an analog subaudio signal (FIG. 6f) which is supplied to a signal output terminal 57. The level of the subaudio signal may be controlled by adjusting the time constant of the integrating circuit (i.e., resistor $R_{54}$ and condenser $C_{51}$).

As described above, since this circuit uses pulse counting, its demodulation performance is superior and the demodulated subaudio signal has high-fidelity. This circuit primarily consists of transistors and resistors and therefore is suitable for fabrication as a semiconductor integrated circuit. This circuit is simple to construct, having a small number of elements. Accordingly, the power required is low.

When this circuit is integrated into a semiconductor integrated circuit, its chip area, the number of outside connection pins and peripheral devices will be reduced. Further, if the power supply in line $L_{51}$ includes a ripple element, the ripple will occur in the same phase for the emitter and base electrodes of transistors $Q_{60}$ and $Q_{61}$; accordingly, a ripple element is not superimposed upon the output of circuit 55.

An ultrasonic delay line or a charge-coupled device can be utilized in lieu of the integrating circuit. Further, the output of circuit 54 can be directly supplied to filter 56. If desired, this circuit not only can be used to demodulate the FM subcarrier signal, but can be used to demodulate another FM signal such as a playback signal of a video disc player or a video tape recorder.

Figure 8:
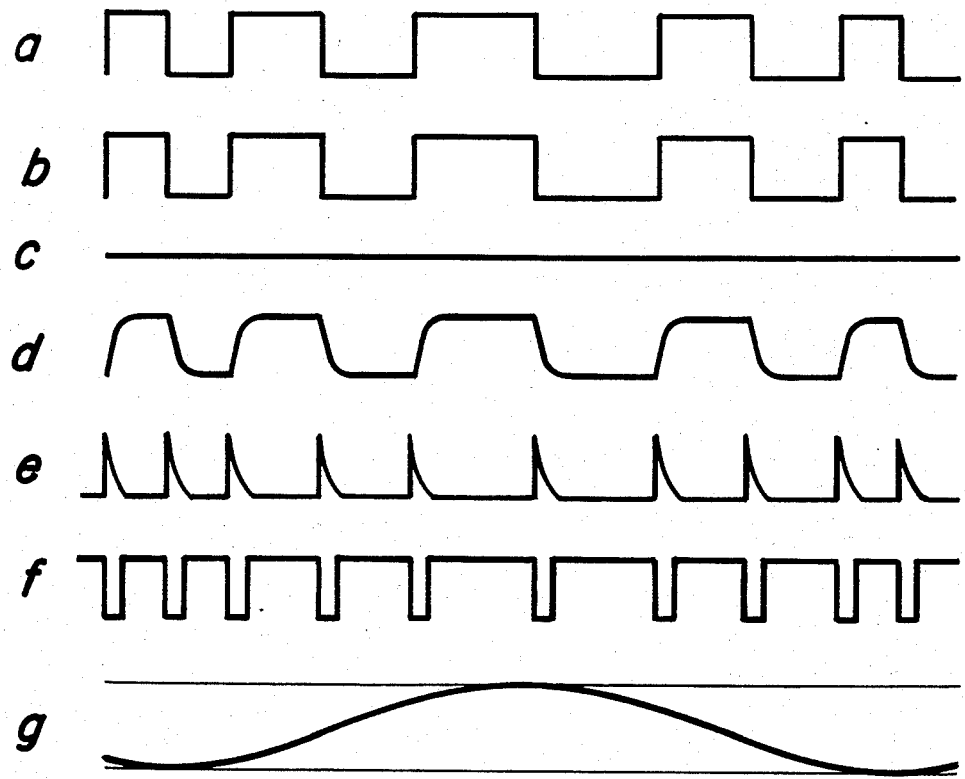
FIG. 8 is a waveform diagram of the signals at each point of the circuit shown in FIG. 7.
Figure 7:
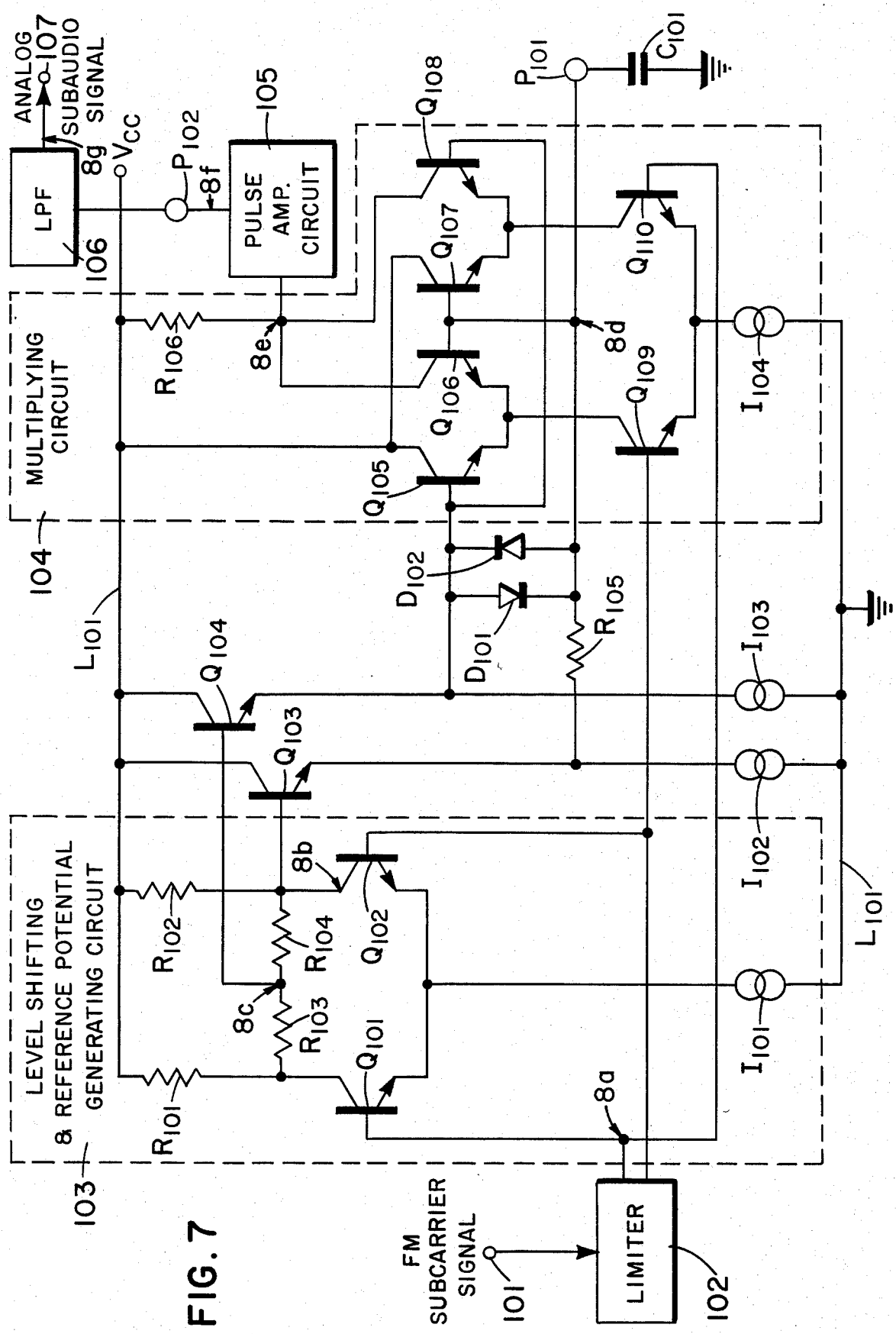
FIG. 7 is a schematic circuit diagram of another embodiment according to the present invention.

Another embodiment according to the present invention is shown in FIG. 7 and the waveforms of the signals at each point of the circuit are shown in FIG. 8. The circuit of FIG. 7, unlike the circuit of FIG. 5, utilizwes a reference potential as an input to the multiplying circuit. An FM subcarrier signal is applied to a limiter 102 through a signal input terminal 101. This FM signal is limited by limiter 102 to remove any noise included in the FM signal. A first limited FM signal (FIG. 8a) is produced at one of a pair of output terminals of limiter 102. A second limited FM signal, having an inverse phase with the phase of the first limited FM signal, is produced at the other output terminal of limiter 102. Each of these limited signals is supplied to a level shifting and reference potential generating circuit 103.

The construction of the level shifting and reference potential circuit 103 is as follows. The base electrode of a transistor $Q_{101}$ is connected to the one output terminal of limiter 102, while its collector electrode is connected to a power supply line $L_{101}$ through a resistor $R_{101}$. The base electrode of a transistor $Q_{102}$ is connected to the other output terminal of limiter 102, while its collector electrode is connected to line $L_{101}$ through a resistor $R_{102}$. The emitter electrodes of transistors $Q_{101}$, $Q_{102}$ are connected to a line $L_{100}$ through a common current source $I_{101}$. Serially connected resistors $R_{103}$ and $R_{104}$ are connected between the collector electrodes of transistors $Q_{101}$ and $Q_{102}$. These transistors have the same characteristics, and resistors $R_{101}$, $R_{102}$ have equal resistance. Likewise, resistors $R_{103}$, $R_{104}$ have the same resistance. Transistors $Q_{101}$, $Q_{102}$ shift the level of output signal of limiter 102. Consequently, potential at the connection point of resistors $R_{103}$ and $R_{104}$ is always constant. The resulting level shifted FM signal (FIG. 8b) is supplied from the collector electrode of transistor $Q_{102}$ to the base electrode of transistor $Q_{103}$ connected in an emitter follower mode. The collector electrode of transistor $Q_{103}$ is connected to line $L_{101}$, while its emitter electrode is connected to $L_{100}$ through a current source $I_{102}$. The reference potential (FIG. 8c), produced at the connection point of resistors $R_{103}$, $R_{104}$, is supplied to the base electrode of transistor $Q_{104}$ connected in an emitter follower mode. The collector electrode of transistor $Q_{104}$ is connected to line $L_{101}$, while its emitter electrode is connected to line $L_{100}$ through a current source $I_{103}$. The emitter of transistor $Q_{103}$ is connected to a delay means which acts as an integrating circuit, that is, a series connected circuit of a resistor $R_{105}$ and a condenser $C_{101}$. One terminal of condenser $C_{101}$ is coupled to resistor $R_{105}$ through an outside connection pin $P_{101}$, while its other terminal is grounded. The delay time is determined by the time constant of the integrating circuit.

The delayed FM signal is limited by diodes $D_{101}$, $D_{102}$. The anode electrode of diode $D_{101}$ is connected to the emitter electrode of transistor $Q_{104}$, and its cathode electrode is coupled to the one terminal of condenser $C_{101}$. The cathode electrode of diode $D_{102}$ is connected to the emitter elecrode of transistor $Q_{104}$, and its anode electrode is coupled to the one terminal of condenser $C_{101}$. Diodes $D_{101}$ and $D_{102}$ limit the delayed FM signal by the forward voltage of the diodes. The delayed and limited FM signal (FIG. 8d) and the reference potential are supplied to a pair of input terminals of a multiplying circuit 104.

The multiplying circuit 104 comprises a double balanced differential amplifier. The base electrodes of transistors $Q_{105}$, $Q_{108}$ are connected to the cathode electrode of diode $D_{102}$, while the base electrodes of transistors $Q_{106}$, $Q_{107}$ are connected to the anode electrode of diode $D_{102}$. The collector electrode of transistors $Q_{105}$, $Q_{107}$ are connected in line $L_{101}$, while the collector electrodes of transistors $Q_{106}$, $Q_{108}$ are connected to the line $L_{101}$ through a resistor $R_{106}$. The collector electrodes of transistors $Q_{106}$, $Q_{108}$ are also connected to a pulse amplifying circuit 105. Circuit 104 includes a further differential amplifier comprising transistors $Q_{109}$, $Q_{110}$. The base electrode of transistor $Q_{109}$ is connected to the other output terminal of limiter 102, while its collector electrode is connected to the emitter electrodes of transistors $Q_{105}$, $Q_{106}$. The base electrode of the transistor $Q_{110}$ is connected to the one output terminal of limiter 101, while its collector electrode is connected to the emitter electrodes of transistors $Q_{107}$, $Q_{108}$. The emitter electrodes of transistors $Q_{109}$, $Q_{110}$ are connected to line $L_{100}$ through a common current source $L_{104}$. Transistors $Q_{109}$, $Q_{110}$ are alternatively switched on by the limited FM signals from limiter 102. Circuit 104, as a result, generates a pulse shaped signal (i.e., a demodulated subaudio signal—FIG. 8e) in accordance with the delay time of the delayed FM signal. The demodulated signal is supplied from the collector electrodes of transistors $Q_{106}$, $Q_{108}$ to a pulse amplifying circuit 105. This circuit is similar to the construction of circuit 55 in FIG. 5. The demodulated signal, amplified by circuit 105 (FIG. 8f), is then supplied to a low pass filter 106 through an outside connection pin $P_{102}$.

The filter 106 transforms the amplified signal into an analog subaudio signal (FIG. 8g) which is supplied to a signal output terminal 107. The level of the subaudio signal may be controlled by adjusting the time constant of the delay means.

This embodiment has the same advantages and permissible modifications as the demodulating circuit shown in FIG. 5. It has, moreover, the following further advantages. Since diodes $D_{101}$, $D_{102}$ are positioned after the delay means, the time constant of the circuit can be increased beyond that permitted with the circuit of FIG. 5. Consequently, the detection efficiency can be improved. Further, since one of the input signals of multiplying circuit 104 is the reference potential, to output signal of the circuit 104 is not subject to the temperature characteristics of diodes $D_{101}$, $D_{102}$ and transistors $Q_{105}$ to $Q_{108}$.

We claim:

1. An FM signal demodulating circuit employing a pulse counting technique, said circuit comprising:

a signal input terminal for receiving an FM signal;

a limiter having an input terminal and a pair of output terminals, said input terminal being coupled to said signal input terminal, one of said output terminals producing a first limited FM signal and the other input terminal producing a second limited FM signal having inverse phase with respect to said first limited FM signal;

a multiplying circuit comprising first, second, third, fourth, fifth and sixth transistors, the base electrode of said first transistor being connected to said other limiter output terminal, the base electrode of said second transistor being connected to said one of said limiter output terminals, the emitter electrodes of said first and second transistors being connected together, the collector electrode of said first transistor being connected to the emitter electrodes of said third and fourth transistors, the collector electrode of said second transistor being connected to the emitter electrodes of said fifth and sixth transistors, the base electrodes of said third and sixth transistors being connected together, the base electrodes of said fourth and fifth transistors being coupled to the output terminal of an integrating circuit, and the collector electrodes of said third and fifth transistors being connected together, said integrating circuit producing a time delay much less than $\pi/4$;

a low pass filter having an input terminal and an output terminal, said input terminal being coupled to the collector electrodes of said fourth and sixth transistors;

a level shifting and reference potential generating circuit having a pair of input terminals and a pair of output terminals, each input terminal being connected to a respective one of said limiter output terminals, one of said output terminals producing a reference potential and being connected to the base electrodes of said third and sixth transistors, and the other output terminal producing a level shifted FM signal and being coupled to an input terminal of said integrating circuit;

a first diode having its anode electrode coupled to said one of the output terminals of said level shifting and reference potential generating circuit and its cthode electrode connected to said integrating circuit output terminal; and a second diode having its anode electrode connected to said integrating circuit output terminal, and its cathode electrode connected to said one of the output terminals of said level shifting and reference potential generating circuit.

\* \* \* \* \*